(12) United States Patent
Yeh et al.

(10) Patent No.: US 8,049,300 B2
(45) Date of Patent: *Nov. 1, 2011

(54) INDUCTOR ENERGY LOSS REDUCTION TECHNIQUES

(75) Inventors: Andrew Yeh, Hsinchu (TW); Alex Chang, Hsinchu (TW); Sung-Pi Tseng, Hsinchu (TW); Chang-Yun Chang, Taipei (TW); Hao-Yu Chen, Hsinchu (TW); Fu-Liang Yang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 953 days.

This patent is subject to a terminal disclaimer.

(21) Appl. No.: 11/767,836

(22) Filed: Jun. 25, 2007

(65) Prior Publication Data

US 2007/0246798 A1  Oct. 25, 2007

Related U.S. Application Data

(62) Division of application No. 10/950,046, filed on Sep. 24, 2004, now Pat. No. 7,247,922.

(51) Int. Cl.
 *H01L 27/00* (2006.01)
(52) U.S. Cl. . 257/531; 257/516; 257/528; 257/E21.544; 257/E21.022; 336/196; 336/200
(58) Field of Classification Search .......... 257/531, 257/E21.544, 516, 528, E21.022; 336/190, 336/200
See application file for complete search history.

(56) References Cited

U.S. PATENT DOCUMENTS

| | | | |
|---|---|---|---|
| 5,717,243 A | 2/1998 | Lowther | |
| 5,748,417 A | 5/1998 | Malhorta et al. | |
| 5,754,377 A | 5/1998 | Gray et al. | |
| 5,959,522 A | 9/1999 | Andrews | |
| 6,057,202 A | 5/2000 | Chen et al. | |
| 6,211,753 B1 | 4/2001 | Leifso et al. | |
| 6,489,663 B2 | 12/2002 | Ballantine et al. | |
| 6,593,838 B2 * | 7/2003 | Yue | 336/84 C |
| 6,656,813 B2 | 12/2003 | Ahn et al. | |
| 7,247,922 B2 * | 7/2007 | Yeh et al. | 257/516 |
| 2002/0093414 A1 | 7/2002 | Wong et al. | |
| 2003/0006415 A1 * | 1/2003 | Yokogawa et al. | 257/531 |
| 2005/0258507 A1 * | 11/2005 | Tseng et al. | 257/531 |

FOREIGN PATENT DOCUMENTS

WO   WO 98/50956   12/1998

(Continued)

OTHER PUBLICATIONS

Yong-Ho Cho, "A Novel Active Inductor and Its Application to Inductance-Controlled Oscillator", IEEE Transactions on Microwave Theory and Techniques, vol. 45, No. 8, 0018-9480/97, Aug. 1997, pp. 1208-1213.

(Continued)

*Primary Examiner* — Junghwa M Im
(74) *Attorney, Agent, or Firm* — Haynes and Boone, LLP

(57) ABSTRACT

An inductive device including an inductor coil located over a substrate, at least one electrically insulating layer interposing the inductor coil and the substrate, and a plurality of current interrupters each extending into the substrate, wherein a first aggregate outer boundary of the plurality of current interrupters substantially encompasses a second aggregate outer boundary of the inductor coil.

12 Claims, 6 Drawing Sheets

FOREIGN PATENT DOCUMENTS

WO        WO 02/49110        6/2002

OTHER PUBLICATIONS

Lucyszyn, Stepan, "Monolithic Narrow-Band Filter Using Ultrahigh-Q Tunable Active Inductors", IEEE Transactions on Microwave Theory and Techniques, vol. 42, No. 12, 0018-9480/94, Dec. 1994, pp. 2617-2622.

Chang, C.A., et al., "Characterization of Spiral Inductors with Patterned Floating Structures", IEEE Transactions on Microwave Theory and Techniques, vol. 52, No. 5, 0018-9480/04, May 2004, pp. 1375-1381.

* cited by examiner

INDUCTOR ENERGY LOSS REDUCTION TECHNIQUES

CROSS-REFERENCE

This application is a divisional of U.S. patent application Ser. No. 10/950,046 filed Sep. 24, 2004, which is hereby incorporated by reference. This application is related to U.S. application Ser. No. 10/851,021 filed on May 21, 2004.

BACKGROUND

RF inductors play an essential role in microwave front-end modules, including low noise amplifiers and voltage-controlled oscillators. For on-chip inductors, a spiral-shape inductor is often implemented. However, such implementation often exhibits a low quality factor Q at desired operating frequencies. Quality factor is the ratio of energy stored in the inductor to the energy loss in the inductor. Low-Q inductors drain more energy and generate excessive electronic noise. The lossy nature of silicon substrates employed with such inductors, as well as the resistive loss attributable to metal lines in such microelectronic devices, make it difficult to design high-Q inductors.

Substrate losses are at least partially caused by eddy currents induced by current flowing in the metal lines of the device. Approaches to minimize the eddy currents and, thereby, to reduce substrate losses include removing portions of the substrate and forming large doped regions encompassing the footprint of the inductor coil. However, the substrate removal approach results in poor resistance to environmental vibration and is difficult to integrate with existing fabrication processes. In addition, the large doped region approach provides little reduction in eddy current, partially because eddy currents can flow inside the doped regions.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
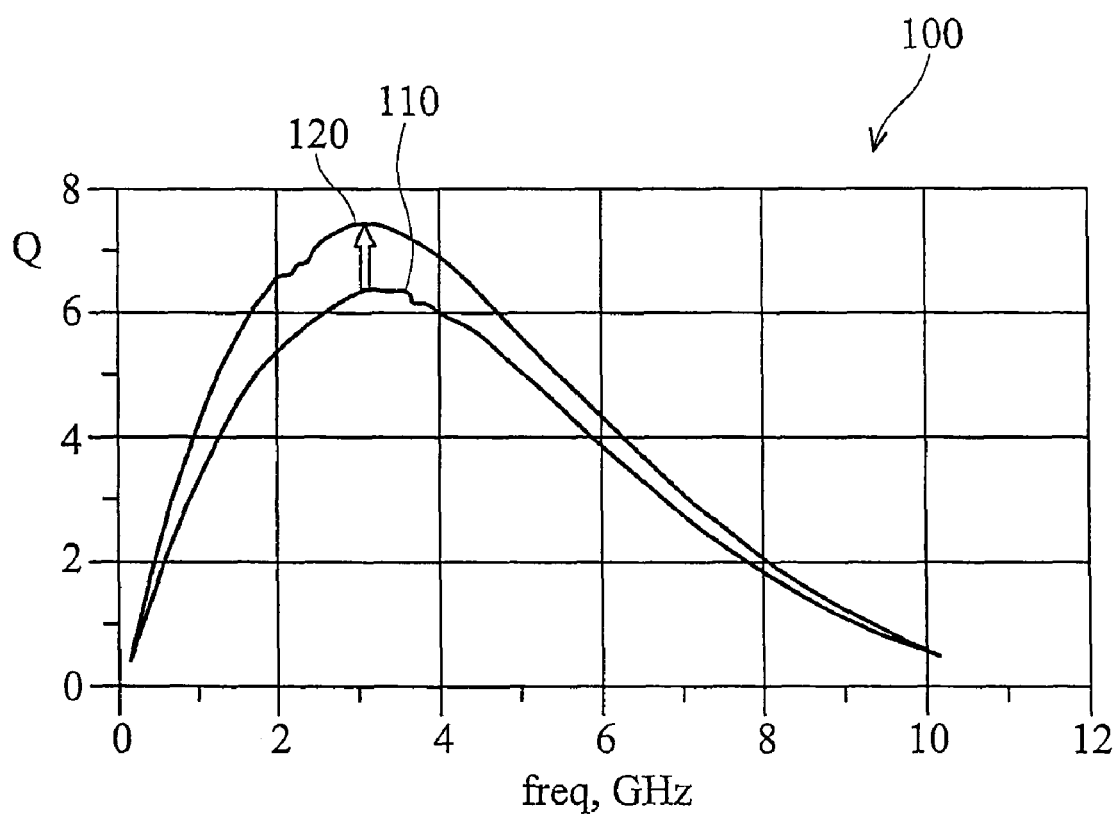
FIG. 1 is a graph relating quality factor to device operating frequency.

The following disclosure provides many different embodiments, or examples, for implementing different features of various embodiments. Specific examples of components and arrangements are described below to simplify the present disclosure. These are merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a graph 100 depicting the increase in quality factor Q that may be attainable by some embodiments of microelectronic devices employing one or more aspects of the present disclosure. The x-axis of the graph 100 represents an operating frequency of a microelectronic device, and the y-axis represents quality factor as it may relate to the operating frequency. The graph 100 includes a curve 110 which may represent the relationship between operating frequency and quality factor for a first microelectronic device. The graph 100 also includes a curve 120 which may represent the relationship between operating frequency and quality factor for a second microelectronic device. Some embodiments within the scope of the present disclosure may exhibit an improved quality factor, as represented by the quality factor shirt of curve 120. However, all embodiments within the present disclosure may not conform to the specific or general behavior, characteristics, or intent demonstrated by either curve 110 or curve 120 in FIG. 1. For example, microelectronic devices operating at frequencies other than those shown in FIG. 1, or having quality factors other than those shown in FIG. 1, or exhibiting a relationship between operating frequency and quality factor different than those shown in FIG. 1, may also be within the scope of the present disclosure.

Figure 2:
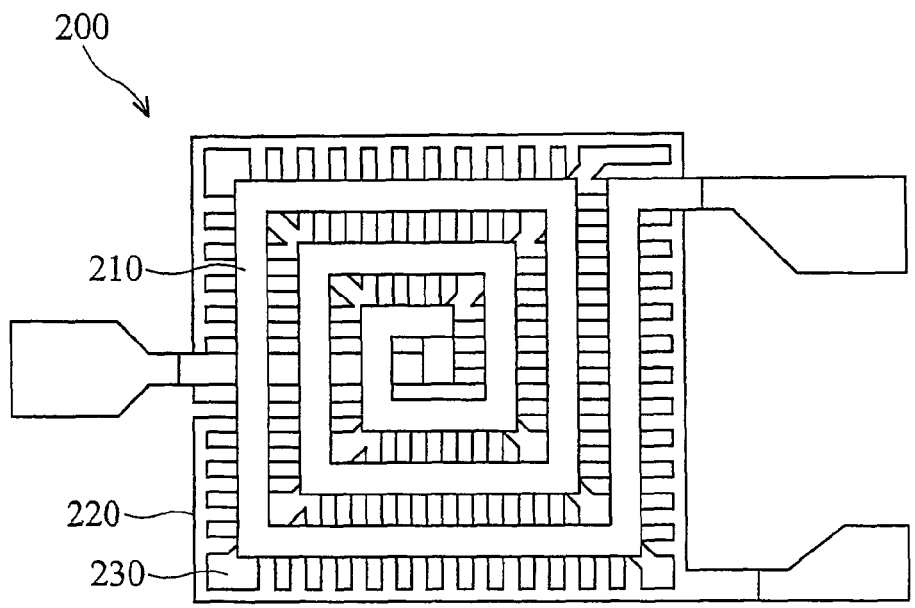
FIG. 2 is a top view of at least a portion of one embodiment of a microelectronic device according to aspects of the present disclosure.

Referring to FIG. 2, illustrated is a perspective view of at least a portion of one embodiment of a microelectronic device 200 according to aspects of the present disclosure. The device 200 includes an inductive element 210 located over a substrate 220. The inductive element 210 may comprise a coiled conductor, possibly comprising aluminum, copper, gold, and/or other conductive materials. Although the inductive element 210 is represented in FIG. 2 as having about three turns and a substantially rectangular spiral shape, inductive elements having other shapes and/or numbers of turns are also within the scope of the present disclosure. The inductive element 210 may be defined in one or more metal layers formed over the substrate 220, such as by CVD, patterning, and/or other deposition processes. For example, the inductive element 210 may be defined in the fourth or fifth metal layer formed over the substrate 220, such as in the fourth or fifth metal layer in a device interconnect structure.

The substrate 220 may comprise silicon, gallium arsenide, and/or other materials. In one embodiment, the substrate 220 is or comprises a silicon-on-insulator (SOI) substrate, such as a substrate comprising an epitaxially grown or otherwise formed semiconductor layer on an insulator layer. The substrate 220 may comprise one or more conductive and/or insulating layers located thereon, such as those that may be employed to form active or passive devices and/or a device interconnect structure. The substrate 220 may also be electrically grounded.

The substrate 220 also comprises current interrupters (CI) 230. Alternatively, the CI 230 may be formed at least partially through one or more layers located over the substrate 220. The CI 230 may comprise one or more trenches formed in the substrate 220 or layers thereon, wherein the trenches may be at least partially filled with silicon dioxide, low-k dielectric materials, and/or other electrically insulating materials. The trenches may be formed by wet or dry etching and/or other processes. Portions of the CI 230 may also extend above the substrate 220. The depth of the CI 230 may be at least sufficient to block a substantial portion of eddy current generated by current flowing through proximate features. In one embodiment, the depth of the CI 230 may range between about 2 μm. and about 20 μm. For example, the depth of the CI 230 may be about 10 μm. However, other depths greater than 20 μm, including 100 μm and above, are also within the scope of the present disclosure.

The CI 230 may limit current flow within the substrate 220 to within slender conductive sections interposing portions or ones of the CI 230. Consequently, at least in some embodiments according to aspects of the present disclosure, eddy currents in the substrate 220 may be reduced or eliminated. Moreover, the cumulative or aggregate perimeter or footprint of the CI 230 may be substantially similar to the cumulative or aggregate perimeter or footprint of the inductive element 210. For example, the outer boundary of the footprint of the CI 230 may be about 10 percent or otherwise slightly larger than the outer boundary of the footprint of the inductive element 210, and/or the aggregate outer boundary of the CI 230 (or the azimuth projection thereof) may substantially or entirely encompass the outer boundary of the inductive element 210 (or the azimuth projection thereof).

Figure 3:
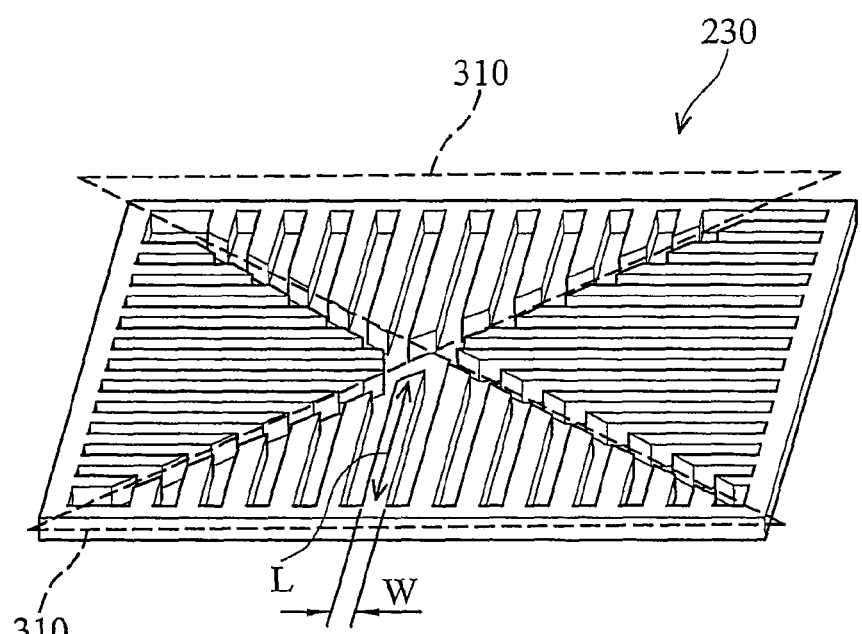
FIG. 3 is a perspective view of at least a portion of the microelectronic device shown in FIG. 2.

Referring to FIG. 3, illustrated is a perspective view of one embodiment of the CI 230 shown in FIG. 2. The CI 230 may have one or more regions 310 each having a plurality of slender and/or elongated fingers or trenches of varying or substantially similar lengths. For example, in the embodiment shown in FIG. 3, the regions 310 are each substantially triangular-shaped and define eleven to thirteen elongated members in the layer(s) 320 and/or a substrate portion in which the regions 310 are formed. The pattern of the CI 230 and/or portions or ones thereof may be configured along directions substantially perpendicular or otherwise non-parallel to the direction of eddy current(s) established by current flowing in adjacent features, including current flowing through the inductive element 210, or magnetic fields induced thereby. In some embodiments, such a configuration may limit the paths along which eddy current may flow, possibly impairing the energy loss mechanism of the eddy current. In some embodiments, such decreased energy loss may increase the quality factor of the inductive element 210. The CI 230 may also increase the effective resistivity of the substrate 220, possibly due to the insulating property of the silicon dioxide or other material(s) forming the CI 230. However, all embodiments within the scope of the present disclosure do not necessarily exhibit these characteristics.

In one embodiment, the slender nature of the fingers or trenches of the CI 230 may encompass features having lengths L that are at least about twice as large as a corresponding width W. One or more of the fingers or trenches of the CI 230 in a region 310 may also have a length about equal to a width thereof, although the width of such fingers or trenches may be substantially similar to the widths of the remaining fingers or trenches in that region 310. In one embodiment, the widths of each of the fingers or trenches of the CI 230 in a region 310 may be substantially similar. For example, each of the fingers or trenches of the CI 230 in a region 310 may have a width about equal to a minimum width or design rule width of the microelectronic device in which the CI 230 are implemented. The depth of the feature(s) forming the CI 230 may also be about substantially equal to a width thereof. However, the aspect ratio of one or more of the features forming the CI 230 may range between about 1:1 and about 8:1, wherein the aspect ratio may be defined as the ratio of depth to width, wherein the width may be a minimum lateral dimension.

Figure 4:
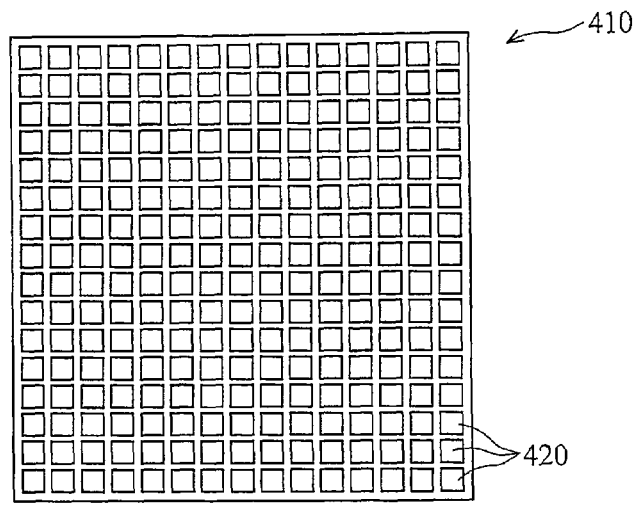
FIG. 4 is a top view of at least a portion of another embodiment of a microelectronic device according to aspects of the present disclosure.

Referring to FIG. 4, illustrated is a top view of another embodiment of the CI 230 shown in FIG. 2, herein designated by the reference numeral 410. The CI 410 may also or alternatively comprise a plurality of features 420 being substantially similar in size. For example, as in the embodiment illustrated in FIG. 4, each of the features 420 may be substantially similar in length and width, such that a footprint or cross-section of each individual feature 420 may be substantially square, or such that each feature 420 may resemble a polyhedron having all right angles. Of course, other geometric shapes may also be employed for the footprint of one or more of the features 420, including substantially circular, polygonal, or other shapes. In addition, although each of the plurality of features 420 may be substantially similar in size, the plurality may comprise footprints of more than one shape. For example, ones of the plurality of features 420 may have a substantially circular footprint, whereas other ones of the plurality of features 420 may have a substantially square footprint. The separation between proximate ones of the plurality of features 420 may also be substantially equal to the width of the features 420 and/or to a minimum width or design rule width of the microelectronic device in which the CI 410 are implemented.

Figure 5:
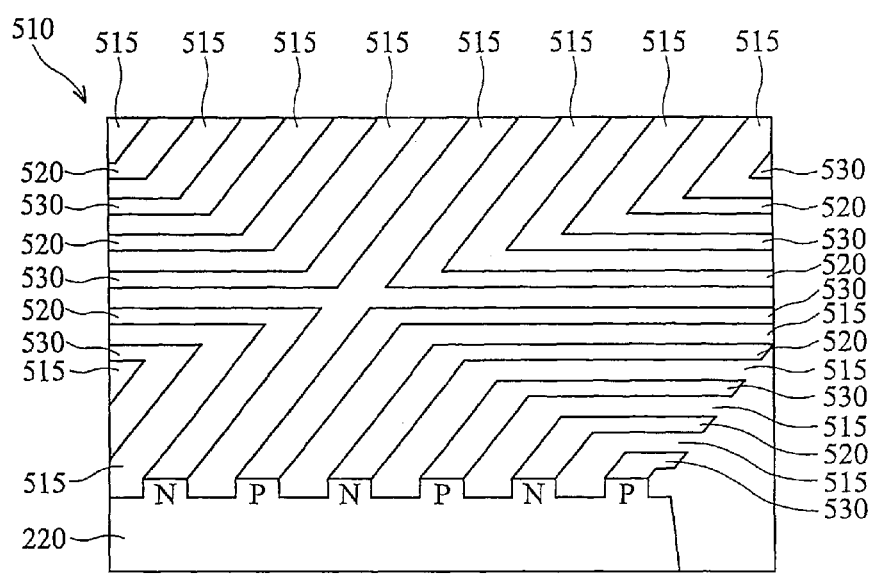
FIG. 5 is a perspective view of at least a portion of another embodiment of a microelectronic device according to aspects of the present disclosure.

Referring to FIG. 5, illustrated is a perspective view of another embodiment of the CI 230 shown in FIG. 2, herein designated by the reference numeral 510. In addition to the electrically insulating portions 515 of the CI 510, the CI 510 and/or the microelectronic device in which they are implemented may comprise one or more doped regions each interposing neighboring ones of the insulating features 515 of the CI 510. Each of the doped regions may establish a dopant junction with the substrate 220.

For example, the substrate 220 may comprise a P doped material or one or more P doped regions (which may hereafter be collectively referred to as a P doped substrate 220), wherein N+ doped regions 520 and/or P+ doped regions 530 may each interpose neighboring pairs of insulating features 515 of the CI 510. Thus, [N+]-[P] junctions may be established between the N+ doped regions 520 and the P doped substrate 220, and [P+]-[P] junctions may be established between the P+ doped regions 530 and the P doped substrate 220. The doped regions 520, 530 may be substantially similar in composition and fabrication to source/drain regions, doped wells, and/or other doped regions formed elsewhere in the microelectronic device in which the CI 510 are implemented. Moreover, configurations other than the alternating P+/N+ doped regions shown in FIG. 5 may also be employed within the scope of the present disclosure, as well as configurations employing only P+ or only N+ doped regions. Doped regions other than P+ and N+ doped regions may also or alternatively be employed. The P doped substrate 220 may also have a doping composition other than the substantially P doped composition described above.

As described above, each or ones of the insulating features 515 of the CI 510, or portions thereof, may be substantially perpendicular or otherwise non-parallel to the direction of eddy current(s) established by current flowing in adjacent features or magnetic fields induced thereby. In addition, each or ones of the doped regions 520, 530, or portions thereof, may be substantially perpendicular or otherwise non-parallel to the direction of eddy current(s) established by current flowing in adjacent features or magnetic fields induced thereby.

In some embodiments, the [N+]-[P] junctions or regions formed thereby, and/or the [P+]-[P] junctions or regions formed thereby, may lower the voltage potential in the P doped substrate 220. Such junctions and/or regions may also prevent displacement current from flowing therethrough. However, all embodiments within the scope of the present disclosure do not necessarily exhibit these characteristics.

Figure 6:
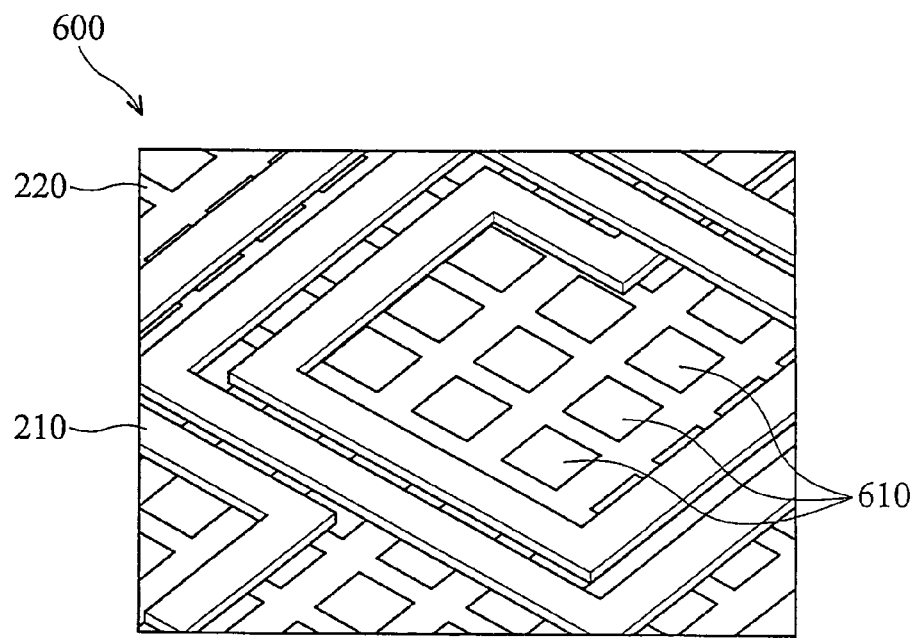
FIG. 6 is a perspective view of at least a portion of another embodiment of a microelectronic device according to aspects of the present disclosure.

Referring to FIG. 6, illustrated is a perspective view of another embodiment of the microelectronic device 200 shown in FIG. 2, herein designated by the reference numeral 600. The microelectronic device 600 comprises an inductive element 210 located over another embodiment of the CI 230 shown in FIG. 2, which are herein designated by reference numerals 610.

In each of the embodiments within the scope of the present disclosure in which CI are employed, such as the CI 230 shown in FIGS. 2 and 3, the CI 410 shown in FIG. 4, and/or the CI 510 shown in FIG. 5, one or more or all of the electrically insulating features forming the CI may be at least partially replaced with conductive material. Thus, a plurality of floating conductive features 610 may be employed, as the conductive features may not be grounded or otherwise connected to a potential source. For example, one or more of the CI 610 may include a conductive member substantially surrounded by electrically insulating material. The conductive portion of such "floating poles" may comprise aluminum, gold, copper, and/or other conductive materials, including non-metallic conductive materials.

In some embodiments employing the "floating poles" described above, the eddy current induced by current flowing through proximate features, such as the inductive element 210, may be restrained within the floating conductive features 610, thereby substantially reducing or eliminating eddy current paths. Employing the floating conductive features 610 may also reduce or otherwise shift the resonant frequency of the device 600, possibly due to an increase in capacitive coupling between the substrate 220 and the inductive element 210.

In addition to being formed in and/or extending from the substrate 220, the floating conductive features 610 may also be formed over and, possibly, physically separated from the substrate 220. For example, the floating conductive features 610 may be formed simultaneously with the formation of conductive gate electrodes of active devices formed outside the perimeter of the inductive element 210. The floating conductive features 610 may also or alternatively be formed simultaneously with the formation of a lower level metal layer that may be formed as part of an interconnection scheme for the active and/or passive microelectronic devices formed outside the perimeter of the inductive element 210. For example, the CI 610 may be defined in a first metal layer formed over the substrate 220, such as the first metal layer in a device interconnect structure.

Figure 7:
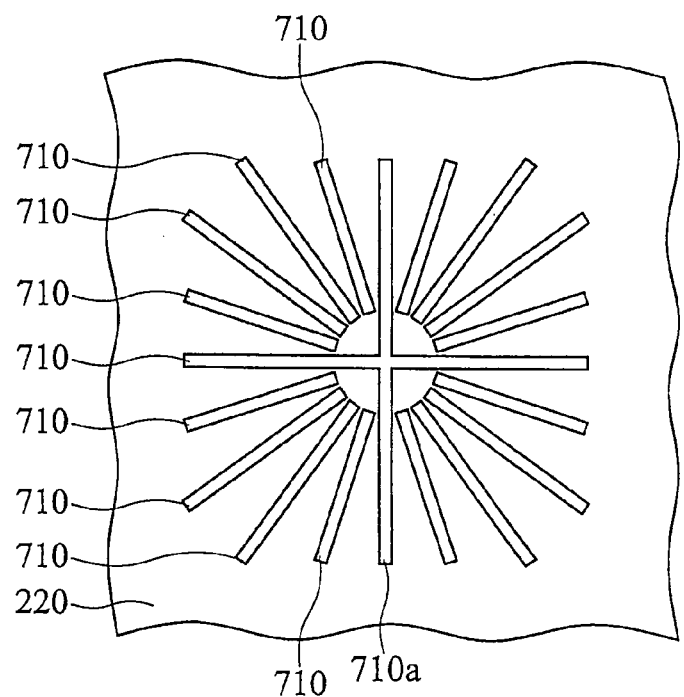
FIG. 7 is a top view of at least a portion of another embodiment of a microelectronic device according to aspects of the present disclosure.

Referring to FIG. 7, illustrated is a top view of another embodiment of the CI 230 shown in FIG. 2, herein designated by reference numerals 710. The CI 710 are substantially similar in composition and manufacture to the CI 230, wherein each of the CI 710: (1) substantially comprise electrically insulating material; (2) substantially comprise conductive material; or (3) comprise a conductive portion substantially encompassed by electrically insulating material. However, the CI 710 have a spoke, spoke-like, or "wagon-wheel" configuration, wherein the CI 710 each extend radially from a central location. Such configured CI 710 may be electrically isolated from other ones of the CI 710, or may be interconnected or integrally formed with ones of the other CI 710, such as CI 710*a* in FIG. 7.

Figure 8:
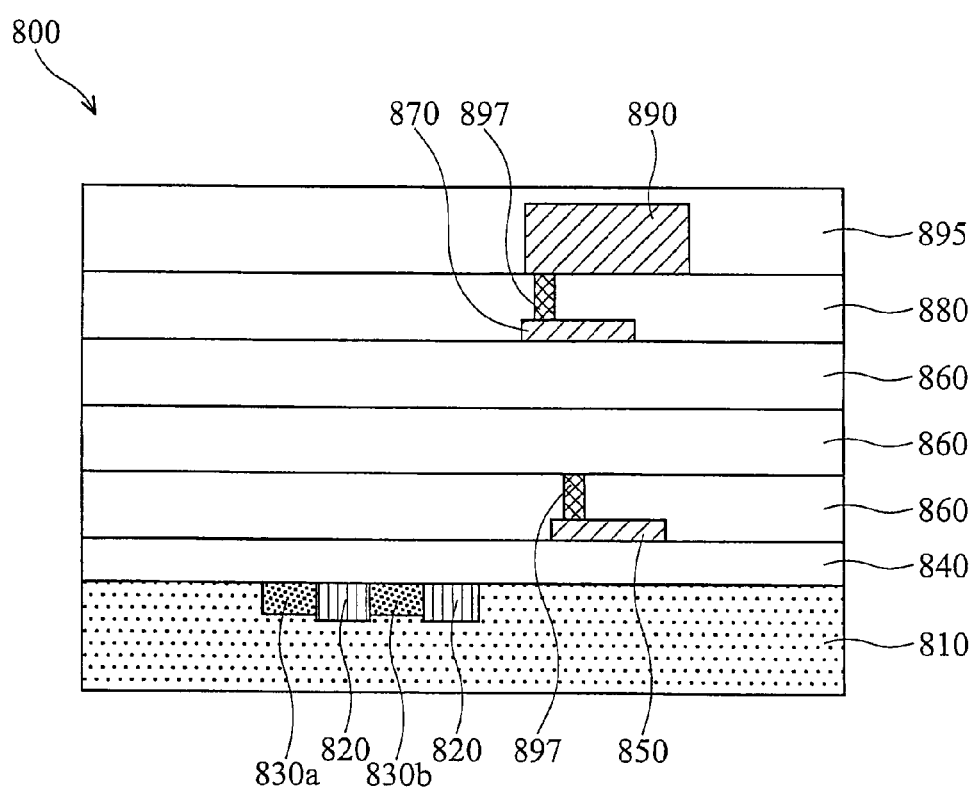
FIG. 8 is a sectional view of at least a portion of one embodiment of a microelectronic device according to aspects of the present disclosure.

Referring to FIG. 8, illustrated is a sectional view of at least a portion of one embodiment of a microelectronic device 800 according to aspects of the present disclosure. The microelectronic device 800 is one environment in which the above-described aspects may be implemented. The microelectronic device 800 may comprise a substrate 810, such as a P type substrate, which may be substantially similar to the substrate 220 described above.

CI 820 may be formed in the substrate 810, and may include doped regions 830*a*, 830*b* formed between insulating ones of the CI 820. The CI 820 may be substantially similar to the CI described above. For example, one or more of the CI 820 may substantially comprise electrically insulating material, may substantially comprise conductive material, or may comprise a conductive portion substantially encompassed by electrically insulating material. The doped regions 830*a*, 830*b* may also be substantially similar to the doped regions described above, such as those shown in FIG. 5. For example, the doped region 830*a* may be a P+ doped well or region, and the doped region 830*b* may be an N+ doped well or region. As shown in FIG. 8, the depth of the insulating portions of the CI 820 may be substantially similar and/or slightly greater (e.g., about 10 percent) than the depth of the doped regions 830*a*, 830*b*. The microelectronic device may also include a greater number of CI 820 than shown in FIG. 8, and may also include a greater number of doped regions 830*a*, 830*b* than shown in FIG. 8.

One or more insulating layers 840 may be formed over the substrate 810, and a metal layer 850 may be formed over the one or more insulating layers 840. The insulating layer(s) may comprise silicon dioxide, low-k dielectric materials, and/or other materials, and may be formed by CVD, spin-on coating, and/or other processes. The metal layer 850 may comprise copper, aluminum, gold, and/or other conductive materials, and may be formed by CVD and/or other processes. The metal layer 850 may have a thickness ranging between about 0.2 µm and about 1.0 µm. For example, the metal layer 850 may have a thickness of about 0.57 µm. In one embodiment, the metal layer 850 may be employed in the interconnection of active and/or passive devices in the microelectronic device 800.

One or more insulating layers 860 may be formed over the metal layer 850. The one or more insulating layers 860 may be substantially similar in composition and manufacture to the one or more insulating layers 840. A metal layer 870 may be formed over the one or more insulating layer 860. The metal layer 870 may be substantially similar in composition and manufacture to the metal layer 850.

One or more insulating layers 880 may be formed over the metal layer 870. The one or more insulating layers 880 may be substantially similar in composition and manufacture to the one or more insulating layers 840. A metal layer 890 may be formed over the one or more insulating layer 880. The metal layer 890 may be substantially similar in composition and manufacture to the metal layer 850. The metal layers 870, 890 may be employed to form an inductive element, such as the inductive element 210 described above. For example, a coiled conductor may be defined in the metal layer 890, and straps or other interconnects may be formed in the metal layer 870 to interconnect the coiled conductor to features outside the perimeter of the coiled conductor. One or more passivation or insulating layers 895 may also be formed over the metal layer 890. One or more vias 897 may also be formed at various levels in the microelectronic device 800, possibly simultaneously with an overlying metal layer.

Figure 9:
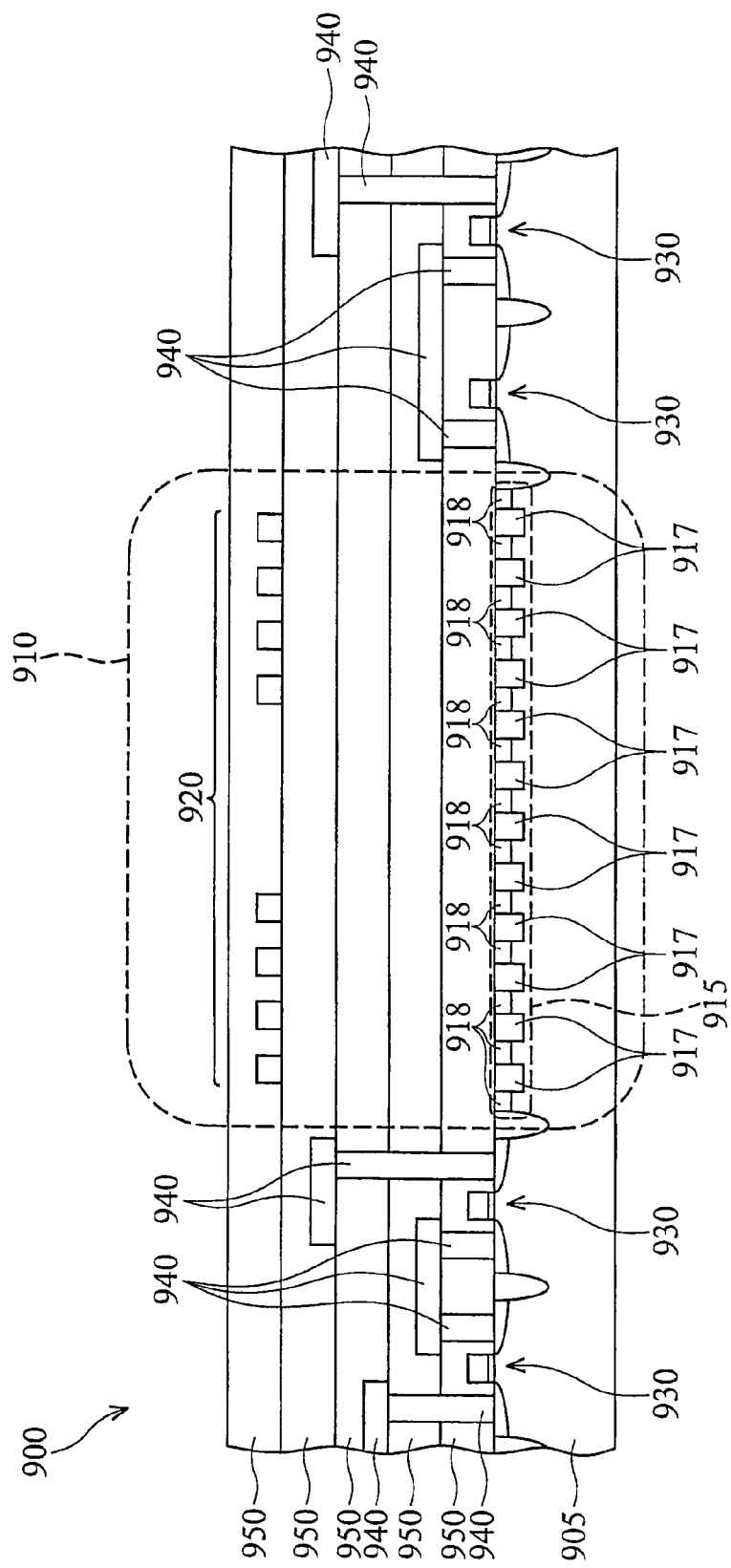
FIG. 9 is a sectional view of at least a portion of one embodiment of an integrated circuit device according to aspects of the present disclosure.

Referring to FIG. 9, illustrated is at least a portion of one embodiment of an integrated circuit device 900 according to aspects of the present disclosure. The integrated circuit device 900 is one environment in which the microelectronic devices described above may be implemented. For example, the integrated circuit device 900 includes an inductor device 910 having an inductive element 920 as well as a plurality of CI 915 located in a substrate 905, wherein a cumulative or aggregate perimeter or outer boundary of the CI 915 substantially corresponds to a cumulative or aggregate perimeter or outer boundary of the inductive element. The CI 915 may be substantially similar to those described above and, as such, may comprise a plurality of insulating features 917 interposing ones of a plurality of doped regions 918, wherein the doped regions 918 may each form junctions with the substrate 905.

The integrated circuit device 900 also includes one or more active and/or passive microelectronic devices 930, such as metal-oxide-semiconductor field-effect-transistors (MOSFETs). The integrated circuit device 900 also includes interconnects and/or vias (hereafter collective referred to as interconnects) 940 extending along and/or through one or more dielectric layers 950 to ones of the microelectronic devices 930 and/or the device 910. The interconnects 940 may comprise copper, tungsten, gold, aluminum, and/or other materials, and may be formed by CVD and/or other processes. The dielectric layers 950 may comprise silicon dioxide, low-k dielectric materials, and/or other materials, and may be formed by CVD, spin-on coating, and/or other processes.

At least some embodiments of microelectronic and/or inductor devices constructed according to aspects of the present disclosure may exhibit a reduced resonant frequency and/or an operation frequency $f_{max}$, which is the operating frequency at which a maximum quality factor may be obtained. Thus, the frequency response of such devices may be adjusted, possibly without influencing the performance of the inductive elements therein. In some embodiments, the combination of insulating CI and floating dopant junctions can reduce the magnetic energy loss due to eddy current, possibly increasing quality factor. However, all embodiments of devices incorporating one or more aspects of the present disclosure do not necessarily exhibit these characteristics.

Thus, the present disclosure provides an inductive device including, in one embodiment, an inductor coil located over a substrate, at least one electrically insulating layer interposing the inductor coil and the substrate, and a plurality of CI each extending into the substrate, wherein a first aggregate outer boundary of the plurality of CI substantially encompasses a second aggregate outer boundary of the inductor coil. The plurality of CI may be at least partially filled with: (1) an electrically insulating material; (2) an electrically conductive material; or (3) an electrically conductive portion substantially surrounded by an electrically insulating material. Another embodiment of an inductive device introduced in the present disclosure includes an inductor coil located over a substrate, at least one insulating layer interposing the inductor coil and the substrate, and a plurality of current interrupters each defined in a metal layer interposing the at least one insulating layer and the inductor coil.

The present disclosure also introduces a method of manufacturing an inductor device including, in one embodiment, forming a plurality of trenches in a substrate, filling at least partially each of the plurality of trenches, and forming at least one insulating layer over the substrate, including over the plurality of trenches. An inductor coil is formed over the insulating layer, wherein the inductor coil has a first aggregate outer boundary substantially encompassed by a second aggregate outer boundary of the plurality of trenches.

An integrated circuit device is also provided in the present disclosure. In one embodiment, the integrated circuit device includes a plurality of microelectronic devices each located at least partially in a substrate, a plurality of CI each extending into the substrate, and an interconnect structure located over the plurality of microelectronic devices and the plurality of CI. The plurality of CI may have a first aggregate outer boundary exclusive of ones of the plurality of microelectronic devices. The interconnect structure may include interconnects interconnecting ones of the plurality of microelectronic devices, as well as an inductor coil having a second aggregate outer boundary substantially encompassed by the first aggregate outer boundary of the plurality of CI.

The foregoing has outlined features of several embodiments so that those skilled in the art may better understand the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit device, comprising:
  a plurality of microelectronic devices each located at least partially in a substrate;
  a plurality of current interrupters each extending into the substrate, the plurality of current interrupters having a first aggregate outer boundary exclusive of ones of the plurality of microelectronic devices; and
  an interconnect structure located over the plurality of microelectronic devices and the plurality of current interrupters and including:
    interconnects interconnecting ones of the plurality of microelectronic devices; and
    an inductor coil having a second aggregate outer boundary substantially encompassed by the first aggregate outer boundary of the plurality of current interrupters.

2. The integrated circuit device of claim 1 wherein at least one of the interconnects is electrically connected to the inductor coil.

3. The integrated circuit device of claim 1 wherein the plurality of current interrupters each substantially comprise an electrically insulating material.

4. The integrated circuit device of claim 1 wherein the plurality of current interrupters each substantially comprise an electrically conductive material.

5. The integrated circuit device of claim 1 wherein the plurality of current interrupters each comprise a conductive portion substantially surrounded by an electrically insulating material.

6. The integrated circuit device of claim 1 wherein each of the plurality of current interrupters has a substantially circular cross-section.

7. The integrated circuit device of claim 1 wherein each of the plurality of current interrupters has a length about equal to a width thereof.

8. The integrated circuit device of claim 1 wherein ones of the plurality of current interrupters form elongated electrically insulating regions in the substrate.

9. The integrated circuit device of claim 1 wherein the plurality of current interrupters has a radial spoke configuration.

10. The integrated circuit device of claim 1 wherein the substrate is a doped substrate and comprises a plurality of doped regions each interposing a pair of the plurality of current interrupters and forming a dopant junction with the doped substrate.

11. The integrated circuit device of claim 10 wherein the plurality of doped regions includes a plurality of first doped regions each having a first dopant type and a plurality of second doped regions each having a second dopant type.

12. The integrated circuit device of claim 1 wherein ones of the plurality of current interrupters are oriented substantially perpendicular to an eddy current established by current flowing through the inductor coil.

\* \* \* \* \*